(12) United States Patent
Chen et al.

(10) Patent No.: US 11,988,711 B2
(45) Date of Patent: May 21, 2024

(54) TEST CIRCUIT AND TEST METHOD

(71) Applicant: REALTEK SEMICONDUCTOR CORPORATION, Hsinchu (TW)

(72) Inventors: Po-Lin Chen, Hsinchu (TW); Chun-Teng Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 18/175,471

(22) Filed: Feb. 27, 2023

(65) Prior Publication Data

US 2023/0288478 A1    Sep. 14, 2023

(30) Foreign Application Priority Data

Mar. 10, 2022 (TW) ................................. 111108789

(51) Int. Cl.
*G01R 31/3177* (2006.01)
*G01R 31/3185* (2006.01)

(52) U.S. Cl.
CPC . *G01R 31/3177* (2013.01); *G01R 31/318536* (2013.01); *G01R 31/318541* (2013.01); *G01R 31/318544* (2013.01); *G01R 31/318594* (2013.01)

(58) Field of Classification Search
CPC ........ G01R 31/3177; G01R 31/318536; G01R 31/318541; G01R 31/318544; G01R 31/318594
USPC ................................. 714/726, 727, 729, 731
See application file for complete search history.

(56) References Cited

U.S. PATENT DOCUMENTS

| | | | | |
|---|---|---|---|---|
| 6,587,981 | B1* | 7/2003 | Muradali | G01R 31/318555 714/733 |
| 7,401,277 | B2* | 7/2008 | Yamada | G01R 31/318572 714/699 |
| 10,955,472 | B1* | 3/2021 | Trock | G01R 31/31721 |
| 11,320,485 | B1* | 5/2022 | Garg | G01R 31/318335 |

(Continued)

FOREIGN PATENT DOCUMENTS

TW            202201027 A        1/2022

OTHER PUBLICATIONS

Mullane et al. IEEE 1500 Core Wrapper Optimization Techniques and Implementation, 2008, IEEE, pp. 1-10. (Year: 2008).*

(Continued)

*Primary Examiner* — John J Tabone, Jr.
(74) *Attorney, Agent, or Firm* — WPAT, P.C.; Anthony King (57) ABSTRACT

A test circuit includes a scan chain and a wrapper chain. The wrapper chain shifts in a test pattern according a first clock. The scan chain is coupled to the wrapper chain via a logic combination of a circuit under test. The wrapper chain is configured to transmit the test pattern to the scan chain via the logic combination according to a second clock in a capture phase. The wrapper chain includes a first, a second wrapper cell, and an asynchronous register. The first wrapper cell sequentially shifts in two bits of the test pattern in the shift-in phase. The second wrapper cell shifts in the first bit of the test pattern in the shift-in phase. The asynchronous register conducts the first wrapper cell to the second wrapper cell in the shift-in phase, and latches the second wrapper cell in the capture phase.

20 Claims, 8 Drawing Sheets

(56) References Cited

U.S. PATENT DOCUMENTS

| | | | |
|---|---|---|---|
| 2007/0208971 A1* | 9/2007 | Goel | G01R 31/318541 |
| | | | 714/724 |
| 2008/0288842 A1* | 11/2008 | Waayers | G01R 31/318563 |
| | | | 714/E11.002 |
| 2009/0177935 A1* | 7/2009 | McLaurin | G01R 31/31858 |
| | | | 714/E11.002 |
| 2013/0007547 A1* | 1/2013 | Tekumalla | G01R 31/318536 |
| | | | 714/E11.155 |
| 2020/0300914 A1 | 9/2020 | Watanabe et al. | |
| 2021/0399729 A1* | 12/2021 | Laub, III | H01L 27/0233 |
| 2023/0288478 A1* | 9/2023 | Chen | G01R 31/318594 |

OTHER PUBLICATIONS

Yi et al., Core Test Wrapper Design to Reduce Test Application Time for Modular SoC Testing, 2008, IEEE, pp. 412-420. (Year: 2008).*

Yi et al., Low-Cost Scan Test for IEEE-1500-Based SoC, May 2008, IEEE, vol. 57, No. 5, pp. 1071-1078. (Year: 2008).*

English abstract translation of TW 202201027.

* cited by examiner

TEST CIRCUIT AND TEST METHOD

CROSS-REFERENCE TO RELATED APPLICATIONS

This application claims the benefit of priority to patent application Ser. No. 11/108,789, filed in Taiwan on Mar. 10, 2022, which is incorporated by reference in its entirety.

TECHNICAL FIELD

The present application relates to a test circuit and a test method, particularly to a test circuit and a test method related to a scan chain.

BACKGROUND

In order to simulate the real operation of a circuit when testing a circuit, an at-speed clock is generally used. However, the circuit device used to perform the test may not be able to properly transmit the test signal in real time under the at-speed clock. In this case, unknown values may be generated, which may reduce the performance of the test. Therefore, how to effectively test circuits under the at-speed clock has become one of the important issues in the related field.

SUMMARY OF THE INVENTION

An aspect of the present disclosure provides a test circuit configured to test a circuit under test. The test circuit includes a first wrapper chain and a scan chain. The first wrapper chain is configured to shift in a test pattern according to a first clock in a scan in phase. The scan chain is coupled to the first wrapper chain via a first logic combination of the circuit under test. The first wrapper chain is further configured to transmit the test pattern to the scan chain via the first logic combination according to a second clock in a capture phase. The first wrapper chain includes a first wrapper cell, a second wrapper cell, and a first asynchronous register. The first wrapper cell is configured to sequentially shift in a first bit and a second bit of the test pattern in the scan in phase. The second wrapper cell is configured to shift in the first bit of the test pattern from the first wrapper cell in the scan in phase. The first asynchronous register is coupled between the first wrapper cell and the second wrapper cell. The first asynchronous register is configured to conduct an output terminal of the first wrapper cell to an input terminal of the second wrapper cell in the scan in phase, and configured to latch the input terminal of the second wrapper cell in the capture phase.

Another aspect of the present disclosure provides a test method configured to test a circuit under test. The test method includes steps of: in a scan in phase, shifting in a first bit and a second bit of a test pattern to a first wrapper chain according to a first clock; and in a capture phase, transmitting the test pattern to a scan chain via a first logic combination of the circuit under test according to a second clock, to generate a result pattern. The step of shifting in the first bit and the second bit to the first wrapper chain according to the first clock includes steps of: shifting in the second bit to a first wrapper cell of the first wrapper chain; and shifting in the first bit to a second wrapper cell of the first wrapper chain. The step of transmitting the test pattern to the scan chain according to the second clock includes using a first asynchronous register to latch an input terminal of the second wrapper cell.

The test circuit and test method of the present disclosure use asynchronous registers to prevent the generation and transmission of unknown values during the capture phase, thereby improving the performance of the test.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
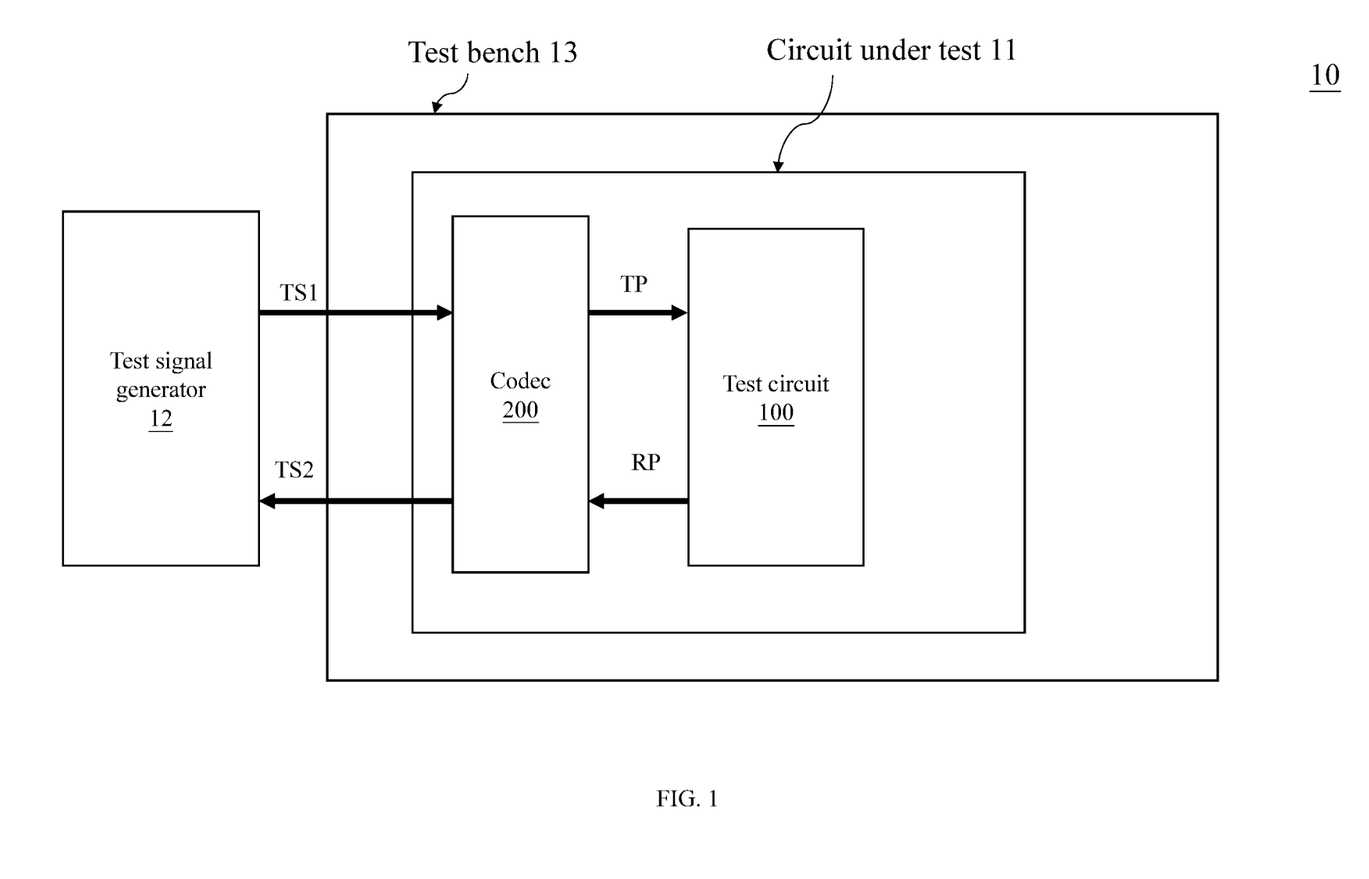
FIG. 1 is a schematic diagram of a test system according to some embodiments of the present disclosure.

FIG. 1 is a schematic diagram of a test system 10 according to some embodiments of the present disclosure. The test system 10 includes a circuit under test 11, a test signal generator 12 and a test bench 13. The test bench 13 is configured to hold the circuit under test 11. In some embodiments, the circuit under test 11 is a chip and includes a test circuit 100 and a codec (coder/decoder) 200. The test signal generator 12 is configured to generate a test signal TS1 to the circuit under test 11. The codec 200 in the circuit under test 11 is configured to receive the test signal TS1, and decode or encode the test signal TS1 into a test pattern TP and transmit the same to the test circuit 100. The test circuit 100 is configured to transmit the test pattern TP to an area under test in the circuit under test 11 and then receive a result pattern RP from the area under test. The codec 200 is configured to receive the result pattern RP from the test circuit 100 for encoding or decoding, and generate a result signal TS2 accordingly. In some embodiments, the test result of the circuit under test 11 can be determined according to the result signal TS2. In some embodiments, the test signal generator 12 uses automatic test pattern generator (ATPG) to generate the test signal TS1.

Figure 2:
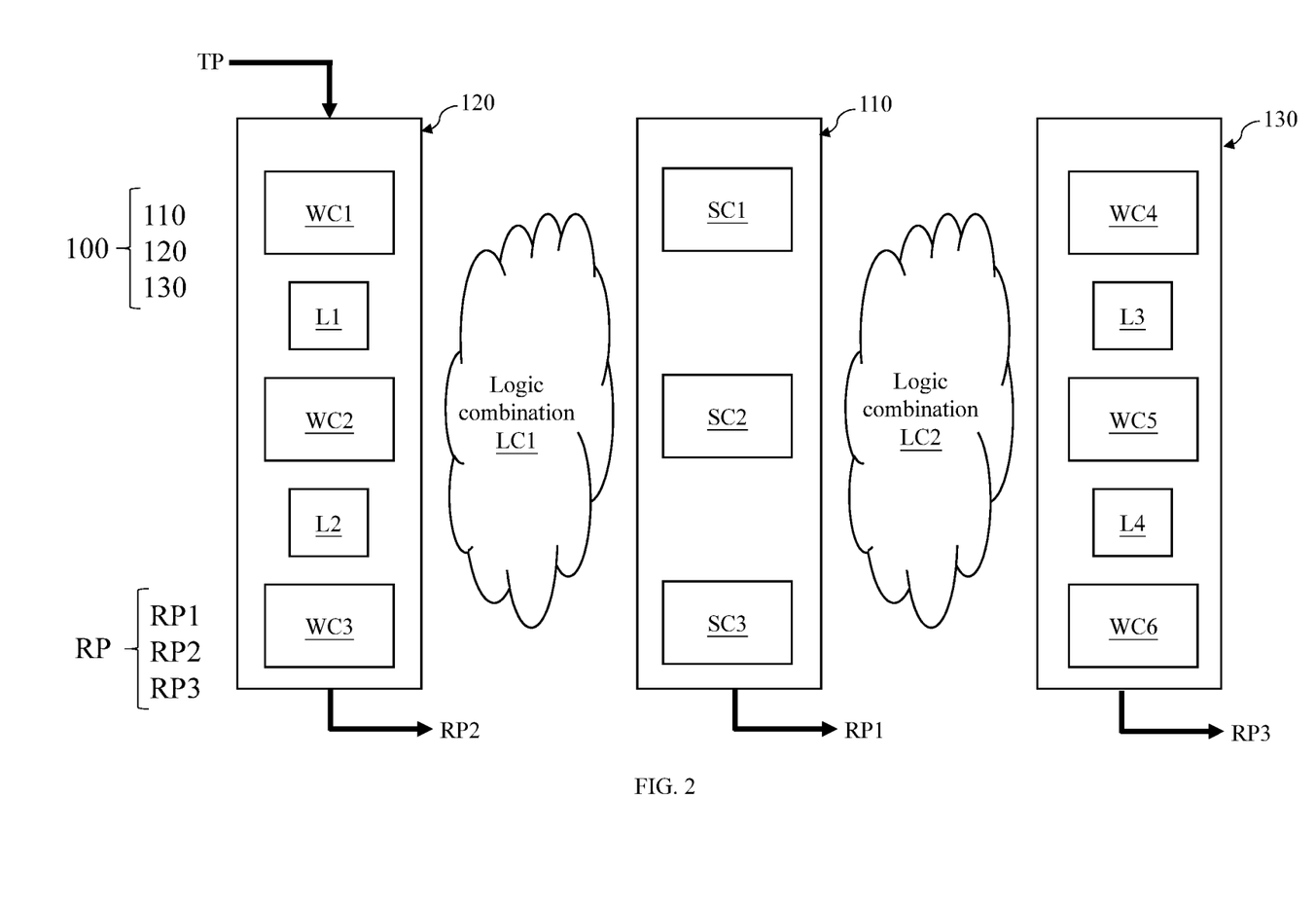
FIG. 2 is a schematic diagram of a circuit under test according to some embodiments of the present disclosure.

FIG. 2 is a schematic diagram of the circuit under test 11 according to some embodiments of the present disclosure. The circuit under test 11 further includes a logic combination LC1 and a logic combination LC2, wherein the logic combination LC1 and logic combination LC2 are areas under test in the circuit under test 11. For ease of understanding, the logic combination LC1 and logic combination LC2 are also illustrated in FIG. 2.

The test circuit 100 includes a scan chain 110, a wrapper chain 120 and a wrapper chain 130. In some embodiments, the wrapper chain 120 is disposed in proximity to an input terminal of the circuit under test 11 (also referred to as an input wrapper chain), and the wrapper chain 130 is disposed in proximity to an output terminal of the circuit under test 11 (also referred to as an output wrapper chain). When the test circuit 100 perform the test, the operations are divided into a scan in phase, a capture phase and a scan out phase. The wrapper chain 120 is configured to receive the test pattern TP from the codec 200 in the scan in phase and transmit the test pattern TP to the scan chain 110 via the logic combination LC1 in the capture phase. In the scan out phase, the wrapper chain 120 and the scan chain 110 output the data therein as the result pattern RP and transmit the same to the codec 200. In some embodiments, the test circuit 100 is configured to perform a core wrapper flow to test the logic combination LC1 and the logic combination LC2. In some embodiments, the logic combination LC1 and the logic combination LC2 are circuit blocks that are not involved in the testing.

In further embodiments, the test circuit 100 further uses the wrapper chain 130 for testing. Specifically, in the capture phase, the scan chain 110 transmit the data received from the logic combination LC1 to the wrapper chain 130 via the logic combination LC2 at the same time. In the scan out phase, the wrapper chain 130, the wrapper chain 120 and the scan chain 110 output the data therein as the result pattern RP and transmit the same to the codec 200. For ease of understanding, in the scan out phase, the result pattern RP shifted out from the scan chain 110, the wrapper chain 120 and the wrapper chain 130 are respectively labeled as the result pattern RP1, the result pattern RP2 and the result pattern RP3.

The scan chain 110 includes a scan cell SC1, a scan cell SC2 and a scan cell SC3. The wrapper chain 120 includes a wrapper cell WC1, a wrapper cell WC2, a wrapper cell WC3, an asynchronous register L1 and an asynchronous register L2. The wrapper chain 130 includes a wrapper cell WC4, a wrapper cell WC5, a wrapper cell WC6, an asynchronous register L3 and an asynchronous register L4.

In some embodiments, the scan cells SC1-SC3 and the wrapper cells WC1-WC6 are scan D flip-flop (DFF), the asynchronous registers L1-L4 are latches. The asynchronous register L1 is coupled between the wrapper cell WC1 and the wrapper cell WC2; the asynchronous register L2 is coupled between the wrapper cell WC2 and the wrapper cell WC3; the asynchronous register L3 is coupled between the wrapper cell WC4 and the wrapper cell WC5; and the asynchronous register L4 is coupled between the wrapper cell WC5 and the wrapper cell WC6. In some embodiments, the wrapper chain 130 does not include the asynchronous register L3 and the asynchronous register L4.

The test pattern TP and the result pattern RP are digital signals that are a plurality of bits arranged in sequence. For ease of understanding, the present disclosure is discussed using the test pattern TP and the result pattern RP having four 4 bits; however, the present disclosure is not limited thereto.

Figure 3A:
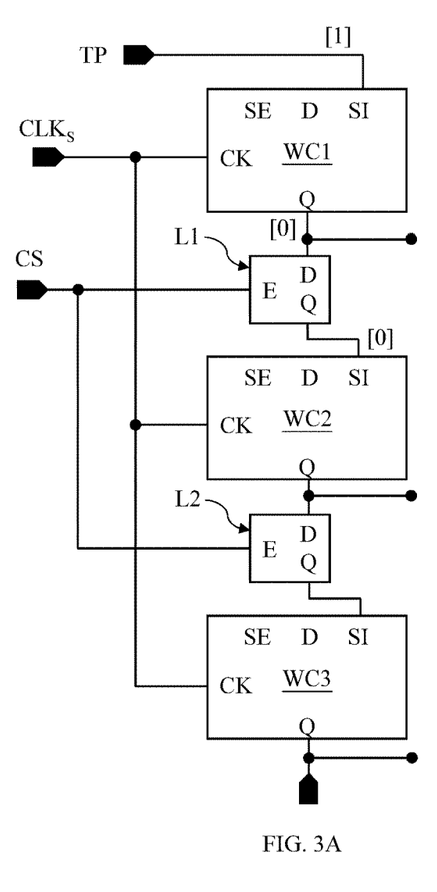
FIG. 3A, 3B, 3C are schematic diagrams of the operations of a test circuit according to some embodiments of the present disclosure.
Figure 3B:
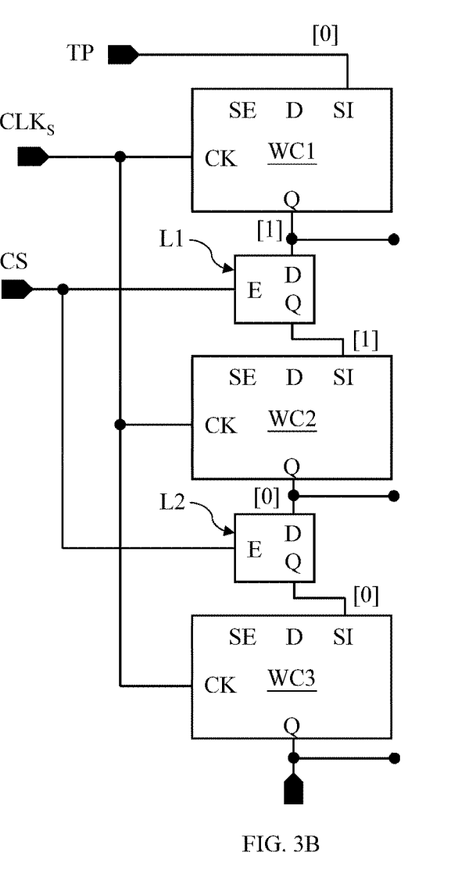
Figure 3C:
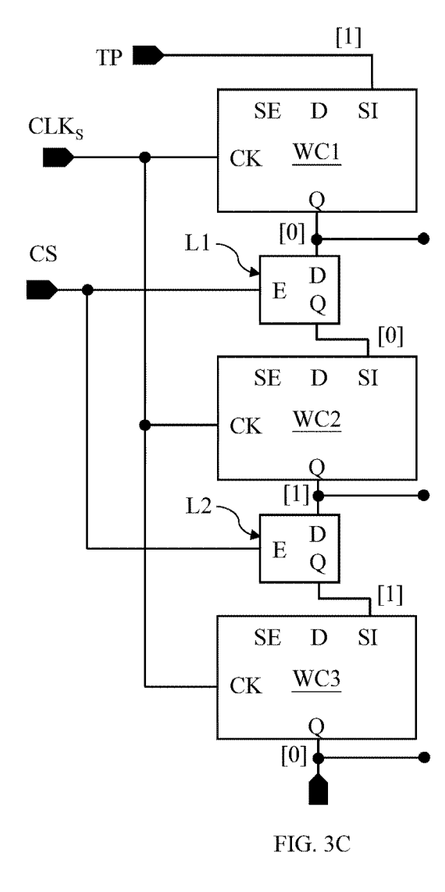
Figure 4A:
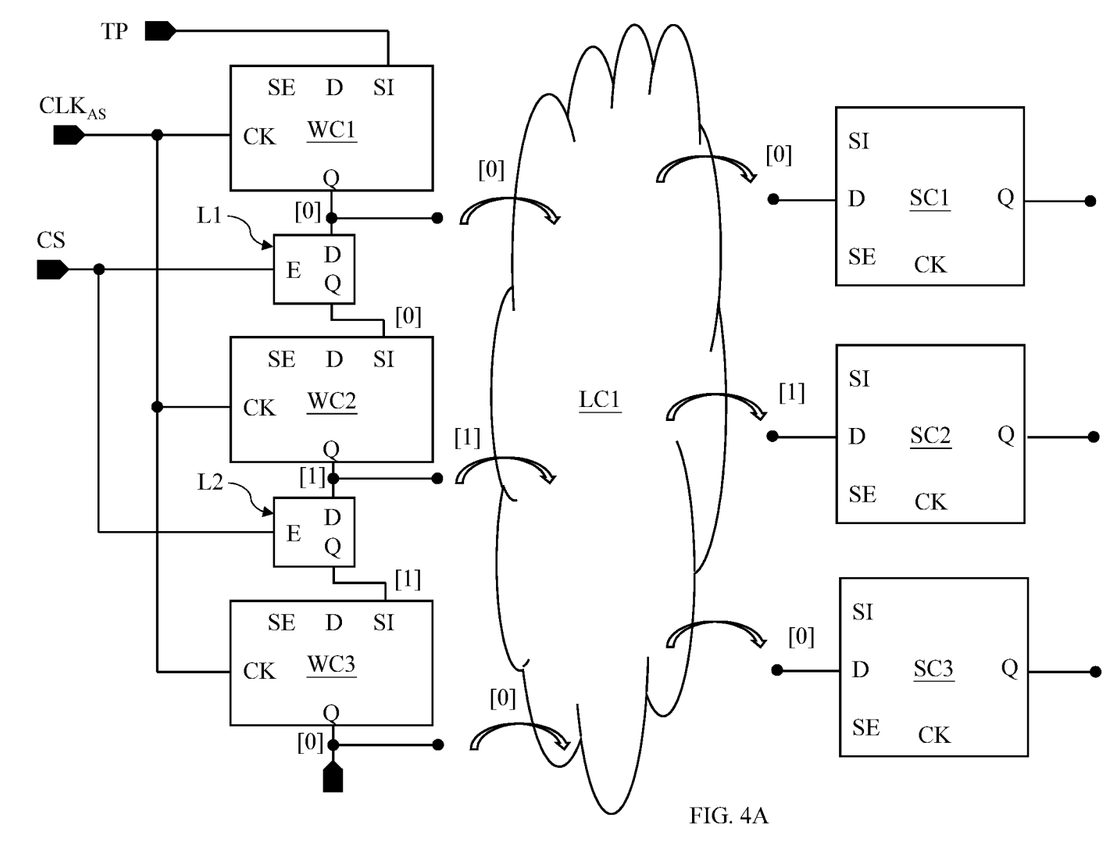
FIG. 4A, 4B, 4C are schematic diagrams of the operations of a test circuit according to some embodiments of the present disclosure.

Reference is made to FIGS. 3A, 3B, 3C, 4A, 4B and 4C. FIGS. 3A, 3B and 3C respectively illustrate the operations of three cycles of a scan clock $CLK_S$ of the wrapper chain 120 in the scan in phase. FIG. 4A illustrates the states of the wrapper chain 120 and the scan chain 110 after the scan in phase is completed, and FIGS. 4B and 4C respectively illustrate the operations of two cycles of a work clock $CLK_{AS}$ of the wrapper chain 120 and the scan chain 110 in the capture phase.

In the scan in phase, the wrapper chain 120 sequentially receives each bit of the test pattern TP according to the scan clock $CLK_S$. In the capture phase, the wrapper chain 120 transmits the test pattern TP to the scan chain 110 via the logic combination LC1 according to the work clock $CLK_{AS}$. In the scan out phase, the scan chain 110 and the wrapper chain 120 respectively output the result pattern RP1 and the result pattern RP2 to the codec 200 sequentially, according to the scan clock $CLK_S$ sequentially. In some embodiments, in the capture phase, the scan chain 110 further transmits the data received from the logic combination LC1 to the wrapper chain 130 via the logic combination LC2 according to scan the work clock $CLK_{AS}$, and in the scan out phase, the wrapper chain 130 outputs the result pattern RP3 to the codec 200 according to the scan clock $CLK_S$.

A frequency of the scan clock $CLK_S$ is lower than a frequency of the work clock $CLK_{AS}$. In some embodiments, the work clock $CLK_{AS}$ is an at-speed clock of the circuit under test 11.

Moreover, in the scan in phase, the asynchronous register L1 conducts an output terminal Q of the wrapper cell WC1 and an input terminal SI of the wrapper cell WC2 according to the control signal CS. The asynchronous register L2 conducts an output terminal Q of the wrapper cell WC2 and an input terminal SI of the wrapper cell WC3 according to the control signal CS. In some embodiments, the control signal CS has logic high potential level in the scan in phase.

For ease of understanding, the test pattern TP is set as a digital sequence of [0101] in sequence, and the values [0], [1], [0], [1] are sequentially shifted into the wrapper chain 120 in the scan in phase.

As shown in FIG. 3A, in the first cycle of the scan clock $CLK_S$, the wrapper cell WC1 of the wrapper chain 120 shifts in the first bit [0] of the test pattern TP, and the output terminal Q of the wrapper cell WC1 has a digital value [0]. In some embodiments, the speed of the scan clock $CLK_S$ is sufficient for the digital value on the output terminal Q of the wrapper cell WC1 to be transmitted to the input terminal SI of the wrapper cell WC2. Hence, after the wrapper cell WC1 shifts in the first bit [0] of the test pattern TP, the input terminal SI of the wrapper cell WC2 also has the same digital value [0].

As shown in FIG. 3B, in the second cycle of the scan clock $CLK_S$, the wrapper cell WC2 shifts in the first bit [0] of the test pattern TP, and the output terminal Q of the wrapper cell WC2 and the input terminal SI of the wrapper cell WC3 have the digital value [0]. The wrapper cell WC1 shifts in the second bit [1] in the test pattern TP, and the output terminal Q of the wrapper cell WC1 and the input terminal SI of the wrapper cell WC2 have the digital value [1]. In the meantime, the input terminal SI of the wrapper cell WC1 receives the third bit [0] of the test pattern TP.

As shown in FIG. 3C, in the third cycle of the scan clock $CLK_S$, the wrapper cell WC3 shifts in the first bit [0] of the test pattern TP, and the output terminal Q of the wrapper cell WC3 has the digital value [0]; the wrapper cell WC2 shifts in the second bit [1] of the test pattern TP, and the output terminal Q of the wrapper cell WC2 and the input terminal SI of the wrapper cell WC3 have the digital value [1]; and the wrapper cell WC1 shifts in the third bit [0] of the test pattern TP, and the output terminal Q of the wrapper cell WC1 and the input terminal SI of the wrapper cell WC2 have the digital value [0]. In the meantime, the input terminal SI of the wrapper cell WC1 receives the fourth bit [1] of the test pattern TP.

After completing the operations of the three cycles of the scan clock $CLK_S$ in the scan in phase, the output terminals Q of the wrapper cells WC1-WC3 respectively have the digital values of the third bit [0], the second bit [1] and the first bit [0] of the test pattern TP.

Figure 4B:
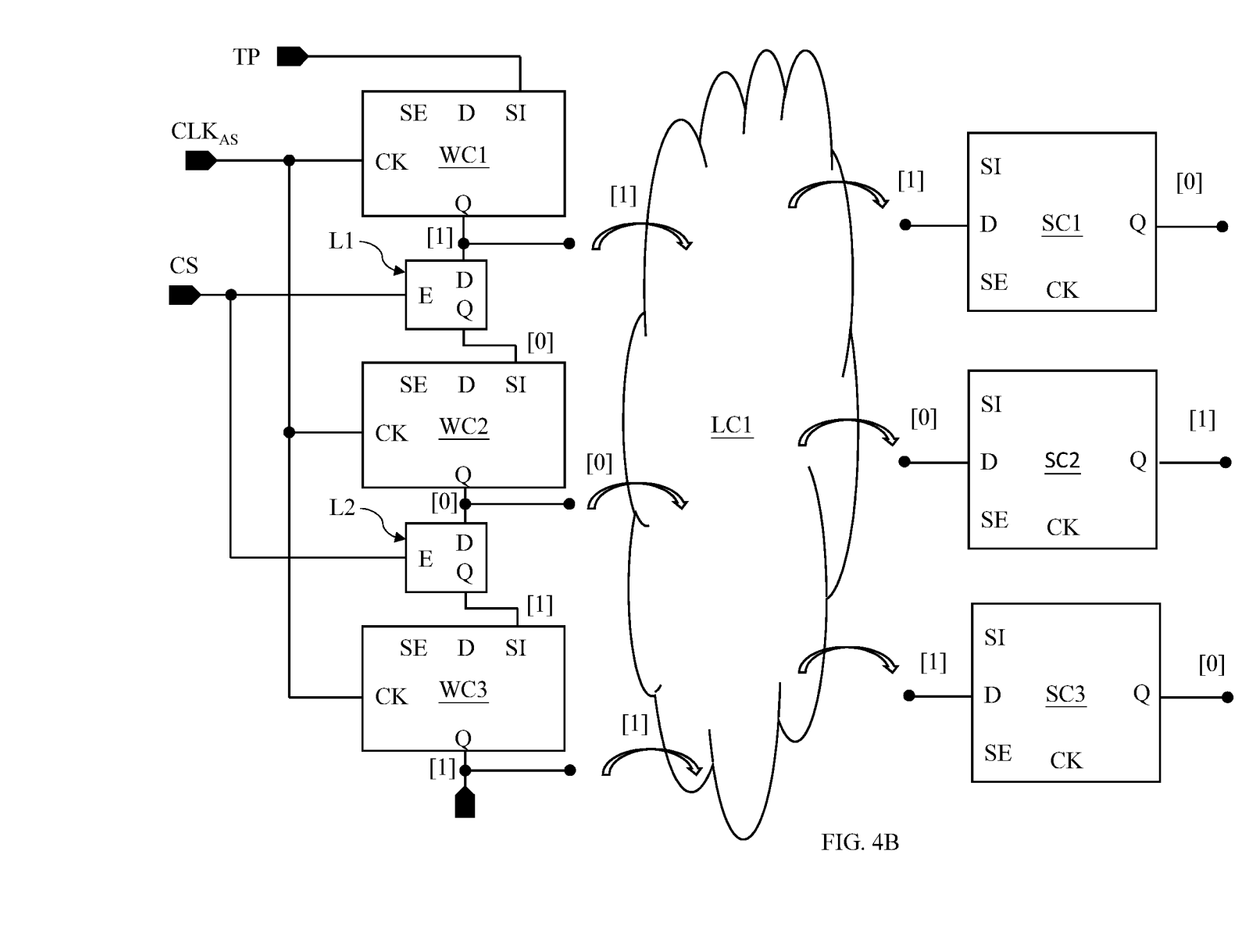
Figure 4C:
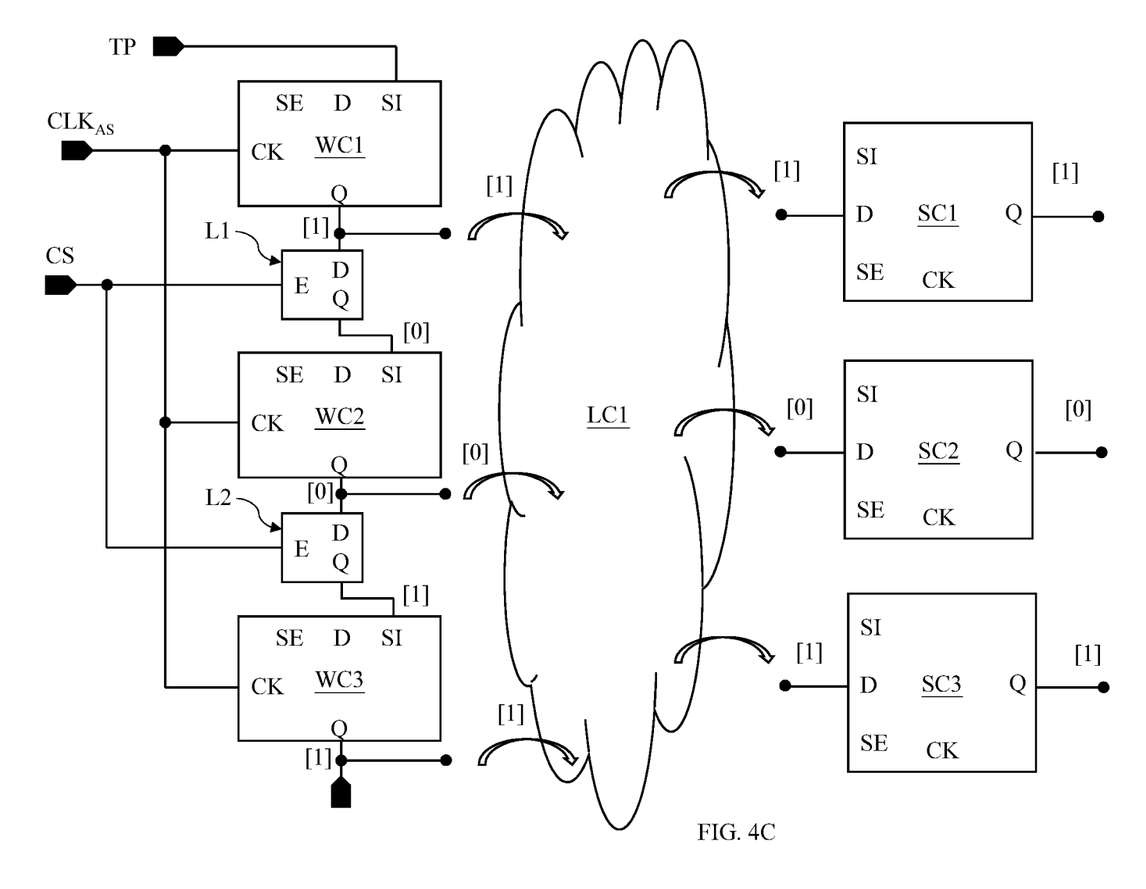

Reference is made to FIGS. 4A, 4B and 4C. FIG. 4A illustrates the states of the wrapper chain 120 and the scan chain 110 after the scan in phase is completed, and FIGS. 4B and 4C respectively illustrate the operations of two cycles of the work clock $CLK_{AS}$ of the wrapper chain 120 and the scan chain 110 in the capture phase. In the capture phase, the asynchronous register L1 is configured to latch the output terminal Q of the wrapper cell WC1 and the input terminal SI of the wrapper cell WC2, and the asynchronous register L2 is configured to latch the output terminal Q of the wrapper cell WC2 and the input terminal SI of the wrapper cell WC3. In some embodiments, the control signal CS has logic low potential level in the capture phase.

As shown in FIG. 4A, after the completion of the scan in phase, the digital values of the three bits of the test pattern TP are also transmitted to input terminals D of the scan cells SC1-SC3 of the scan chain 110 via the logic combination LC1.

As shown in FIG. 4B, in the first cycle of the work clock $CLK_{AS}$, the scan cell SC3 transmits the digital value of the first bit [0] of the test pattern TP to the output terminal Q of the scan cell SC3; in the meantime, the wrapper cell WC3 shifts in the second bit [1] of the test pattern TP, and the output terminal Q of the wrapper cell WC3 and the input terminal D of the scan cell SC3 have the digital value of the second bit [1] of the test pattern TP. Because the asynchronous register L2 latches the input terminal SI of the wrapper cell WC3, the input terminal SI of the wrapper cell WC3 keeps having the digital value of the second bit [1] of the test pattern TP. Similarly, in the first cycle of the work clock $CLK_{AS}$, the output terminals Q of the scan cell SC2 and the scan cell SC1 respectively have the digital values of the second bit [1] and the third bit [0] of the test pattern TP, and input terminals D of the scan cell SC2 and the scan cell SC1 respectively have the digital values of the third bit [0] and the fourth bit [1] of the test pattern TP.

As shown in FIG. 4C, in the second cycle of the work clock $CLK_{AS}$, the scan cell SC3 transmits the digital value of the second bit [1] of test pattern TP to the output terminal Q of the scan cell SC3. Additionally, because the asynchronous register L2 latches the input terminal SI of the wrapper cell WC3, the input terminal SI of the wrapper cell WC3, the output terminal Q of the wrapper cell WC3 and the input terminal D of the scan cell SC3 keep having the digital value of the second bit [1] of the test pattern TP. Similarly, the scan cell SC2 transmits the digital value of the third bit [0] of the test pattern TP to the output terminal Q of the scan cell SC2, and the scan cell SC1 transmits the digital value of the fourth bit [1] of the test pattern TP to the output terminal Q of the scan cell SC1. The input terminals D of the wrapper cell WC1, the wrapper cell WC2 and the scan cell SC1 and the input terminal D of the scan cell SC2 remain unchanged.

It should be noted that in the capture phase, the two digital values transmitted by each of the scan cells SC1-SC3 should be different. In other words, in the capture phase, the two digital values passing through the logic combination LC1 and the logic combination LC2 should have a transition. Because of such transition, the thus-generated result pattern RP are distinguishable.

After the capture phase, the method proceeds to the scan out phase, in which the scan chain 110, the wrapper chain 120 and the wrapper chain 130 shift out each of the result pattern RP1, the result pattern RP2 and the result pattern RP3 sequentially according to the scan clock $CLK_S$. The operation of shifting out is similar to those of the scan in phase, and hence, the detail is not repeated herein.

In the prior art technology, the wrapper chain does not include an asynchronous register, each wrapper cell will perform the shift-in operation in both the shift in phase and the capture phase. When the work clock used in the capture phase is too fast so that the data in the wrapper chain cannot be transmitted to the next level in time, the wrapper cell may generate unknown values, thereby causing the generation of an unknown test result.

Compared with the prior art, an additional asynchronous register is disposed between each wrapper cell of the wrapper chain 120 of the present disclosure, wherein the asynchronous register is configured to latch the input terminals SI of the wrapper cells WC1-WC3 in the capture phase. In this way, even when the wrapper chain 120 operates in the high-speed work clock $CLK_{AS}$, the input terminal SI of each level of the wrapper cells WC1-WC3 can have accurate known values, without any unknown values, thereby making the test result more accurate.

Figure 5:
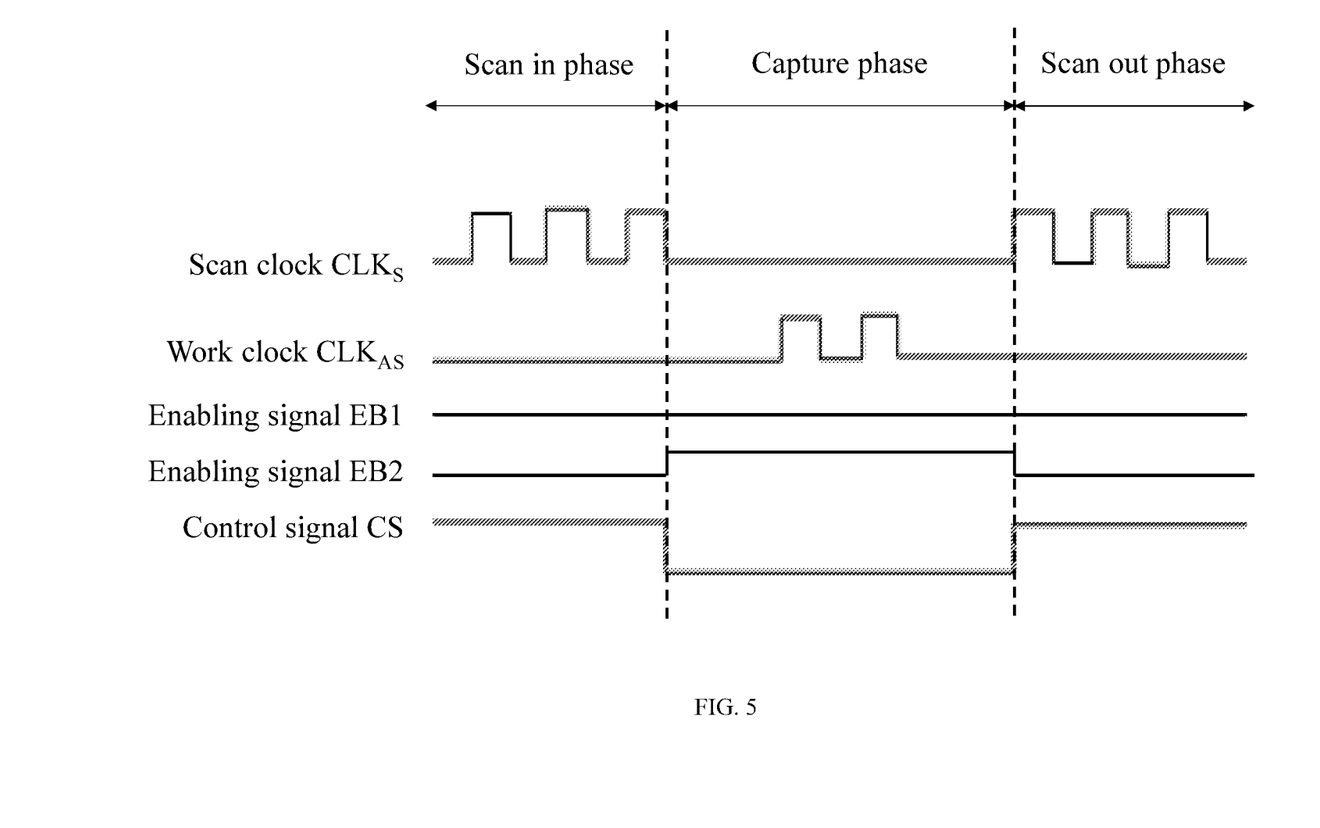
FIG. 5 is a waveform diagram of the operation of a test circuit according to some embodiments of the present disclosure.

Reference is made to FIG. 5. FIG. 5 illustrates the waveforms of the scan in phase, the capture phase and the scan out phase. The waveform diagram includes the scan clock $CLK_S$, the work clock $CLK_{AS}$, a control signal CS, an enabling signal EB1 and an enabling signal EB2. The enabling signal EB1 is provided to enabling terminals SE of the wrapper cells WC1-WC3 and is configured to enable the wrapper cells WC1-WC3. The enabling signal EB2 is provided to enabling terminals SE of the scan cells SC1-SC3 and is configured to enable the scan cells SC1-SC3. For the sake of brevity, the enabling signal EB1 and the enabling signal EB2 are not shown in FIG. 3A-4C.

In the scan in phase and scan out phase, the scan clock $CLK_S$ includes three cycles; the work clock $CLK_{AS}$ is stationary and in a logic low potential level; the enabling signal EB1 provides a logic high potential level to enable the wrapper cells WC1-WC3; the enabling signal EB2 provides a logic low potential level to disable the scan cells SC1-SC3; and the control signal CS provides a logic high potential level to the asynchronous registers L1-L4 to conduct the asynchronous registers L1-L4.

In the capture phase, the scan clock $CLK_S$ is stationary and in a logic low potential level; the work clock $CLK_{AS}$ includes two cycles; the enabling signal EB1 provides a logic high potential level to enable the wrapper cells WC1-WC3; the enabling signal EB2 provides a logic high potential level to enable the scan cells SC1-SC3; and the control signal CS provides a logic low potential level to the asynchronous registers L1-L4 to latch the asynchronous registers L1-L4.

Figure 6:
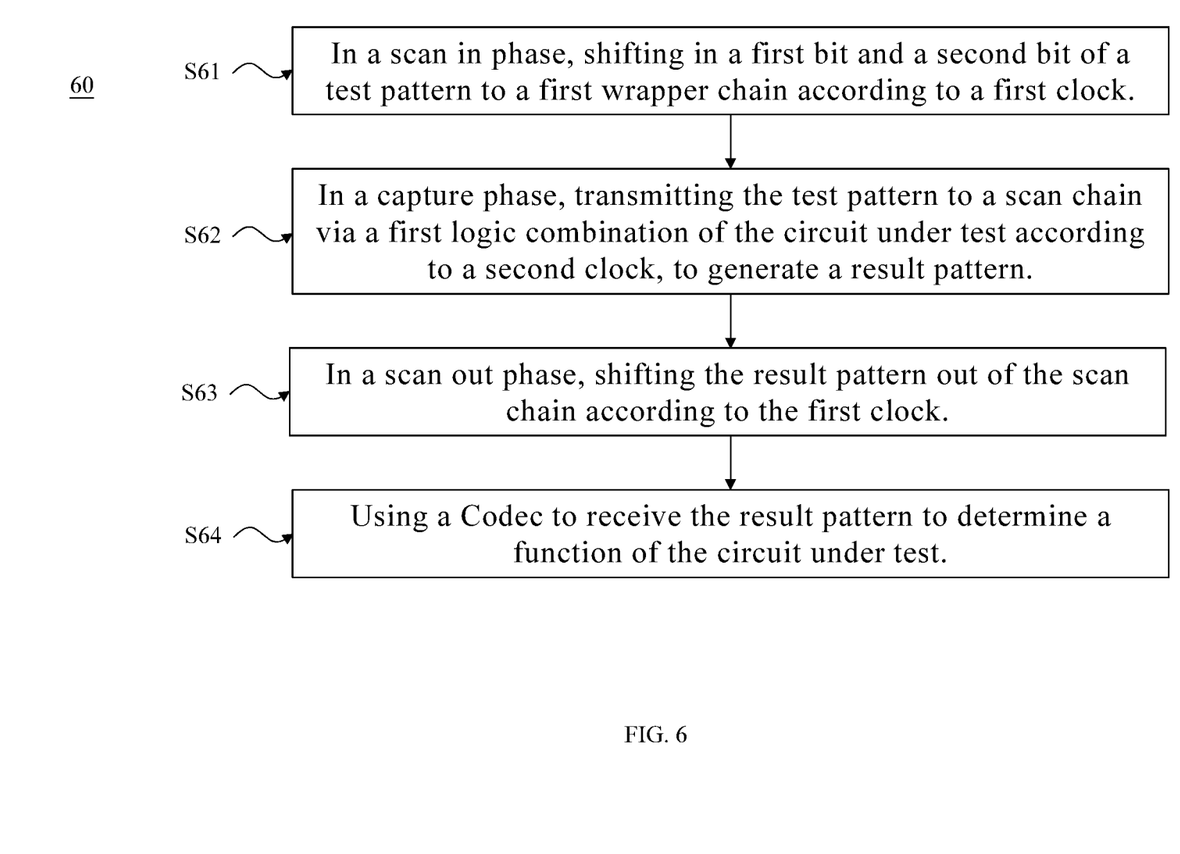
FIG. 6 is a flow chart of a test method according to some embodiments of the present disclosure.

Reference is made to FIG. 6. FIG. 6 is a flow chart of a test method 60. The test method 60 includes the steps S61, S62, S63 and S64. In some embodiments, the test circuit 100 of FIG. 1 is configured to perform the test method 60 to test the circuit under test 11. For ease of understanding, the test method 60 is discussed with reference to the reference numerals of FIG. 1-FIG. 5 and explained with the embodiment where the wrapper chain 120 includes two wrapper cells.

In the step S61, in the scan in phase, the first bit and the second bit of the test pattern TP are shifted in the wrapper chain 120 according to the scan clock $CLK_S$. Specifically, the second bit of the test pattern TP is shifted in the wrapper cell WC1 of the wrapper chain 120, and the first bit of the test pattern TP is shifted in the wrapper cell WC2 of the wrapper chain 120. In this case, the asynchronous register L1 is used to conduct the output terminal Q of the wrapper cell WC1 to the input terminal SI of the wrapper cell WC2.

In the step S62, in the capture phase, the test pattern TP is transmitted to the scan chain 110 via the logic combination LC1 of the circuit under test 11 according to the work clock $CLK_{AS}$, to generate the result pattern RP. In the meantime, the asynchronous register L1 is used to latch the input terminal SI of the wrapper cell WC2. Specifically, in the first cycle of the work clock $CLK_{AS}$, the first bit of the wrapper cell WC2 and the second bit of the wrapper cell WC1 are transmitted to the logic combination LC1, the second bit is shifted in the wrapper cell WC2, and the third bit of the test pattern TP is shifted in the wrapper cell WC1. In the second cycle of the work clock $CLK_{AS}$, the second bit of the wrapper cell WC2 and the third bit of the wrapper cell WC1 are transmitted to the logic combination LC1.

In the step S63, in the scan out phase, the result pattern RP is shifted out of the scan chain 110 according to the scan clock $CLK_S$.

In the step S64, the codec 200 is used to receive the result pattern RP and determine the function of the circuit under test 11 accordingly.

What is claimed is:

1. A test circuit, configured to test a circuit under test, comprising:
   a first wrapper chain, configured to shift in a test pattern according to a first clock in a scan in phase; and
   a scan chain, coupled to the first wrapper chain via a first logic combination of the circuit under test,
   wherein the first wrapper chain is further configured to transmit the test pattern to the scan chain via the first logic combination according to a second clock in a capture phase,
   wherein the first wrapper chain comprises:
      a first wrapper cell, configured to sequentially shift in a first bit and a second bit of the test pattern in the scan in phase;
      a second wrapper cell, configured to shift in the first bit of the test pattern from the first wrapper cell in the scan in phase; and
      a first asynchronous register, coupled between the first wrapper cell and the second wrapper cell, configured to conduct an output terminal of the first wrapper cell to an input terminal of the second wrapper cell in the scan in phase, and latch the input terminal of the second wrapper cell in the capture phase.

2. The test circuit of claim 1, wherein the first asynchronous register is a latch, wherein the first asynchronous register operates according to a control signal, wherein in the scan in phase, the control signal has a first digital value, and in the capture phase, the control signal has a second digital value different from the first digital value.

3. The test circuit of claim 1, wherein a frequency of the second clock is greater than a frequency of the first clock.

4. The test circuit of claim 1, wherein a value of the first bit is different from a value of the second bit.

5. The test circuit of claim 1, wherein the first wrapper chain further comprises:
   a third wrapper cell; and
   a second asynchronous register, coupled between the second wrapper cell and the third wrapper cell, configured to conduct an output terminal of the second wrapper cell to an input terminal of the third wrapper cell in the scan in phase, and latch the input terminal of the third wrapper cell in the capture phase.

6. The test circuit of claim 1, wherein the first wrapper cell and the second wrapper cell are scan DFF.

7. The test circuit of claim 1, further comprising:
   a second wrapper chain, coupled to the scan chain via a second logic combination of the circuit under test, wherein the scan chain is configured to transmit a data received from the first logic combination to the second logic combination according to the second clock in the capture phase.

8. The test circuit of claim 7, wherein the second wrapper chain comprises:
   a fourth wrapper cell; and
   a fifth wrapper cell.

9. The test circuit of claim 8, wherein the second wrapper chain further comprises:
   a third asynchronous register, coupled between the fourth wrapper cell and the fifth wrapper cell.

10. The test circuit of claim 1, wherein the second clock is an at-speed clock of the circuit under test.

11. A test method, configured to test a circuit under test, comprising:
   in a scan in phase, shifting in a first bit and a second bit of a test pattern to a first wrapper chain according to a first clock, comprising:
      shifting in the second bit to a first wrapper cell of the first wrapper chain; and
      shifting in the first bit to a second wrapper cell of the first wrapper chain; and
   in a capture phase, transmitting the test pattern to a scan chain via a first logic combination of the circuit under test according to a second clock, to generate a result pattern, comprising:
      using a first asynchronous register to latch an input terminal of the second wrapper cell.

12. The test method of claim 11, wherein the first asynchronous register is coupled between an output terminal of the first wrapper cell and the input terminal of the second wrapper cell,
   wherein in the scan in phase, the step of shifting in the first bit and the second bit of the test pattern to the first wrapper chain according to the first clock further comprises:
   using the first asynchronous register to conduct the output terminal of the first wrapper cell to the input terminal of the second wrapper cell.

13. The test method of claim 11, further comprising:
   in a scan out phase, shifting the result pattern out of the scan chain according to the first clock.

14. The test method of claim 13, further comprising:
   using a codec to receive the result pattern to determine a function of the circuit under test.

15. The test method of claim 11, wherein a frequency of the first clock is lower than a frequency of the second clock.

16. The test method of claim 11, wherein the first wrapper cell and the second wrapper cell are scan DFF.

17. The test method of claim 11, wherein the first asynchronous register is a latch.

18. The test method of claim 11, wherein the second clock is an at-speed clock of the circuit under test.

19. The test method of claim 11, wherein a value of the first bit of the test pattern is different from a value of the second bit of the test pattern.

20. The test method of claim 11, wherein in the capture phase, the step of transmitting the test pattern to the scan chain via the first logic combination of the circuit under test according to the second clock to generate the result pattern further comprises:
   in a first cycle of the second clock, transmitting the first bit and the second bit to the first logic combination, shifting in the second bit to the second wrapper cell, and shifting in a third bit of the test pattern to the first wrapper cell; and in a second cycle of the second clock, transmitting the second bit and the third bit to the first logic combination.

* * * * *